United States Patent [19]

Balberg

[11] 4,282,537
[45] Aug. 4, 1981

[54] SILICON MOS INDUCTOR
[75] Inventor: Isaac Balberg, Princeton, N.J.
[73] Assignee: RCA Corporation, New York, N.Y.
[21] Appl. No.: 68,013
[22] Filed: Aug. 20, 1979
[51] Int. Cl.³ ............................................. H01L 49/02
[52] U.S. Cl. ......................................... 357/6; 357/2; 357/23; 357/51
[58] Field of Search ........................... 357/23, 2, 6, 51
[56] References Cited
U.S. PATENT DOCUMENTS

| | | | |
|---|---|---|---|
| 4,064,521 | 12/1977 | Carlson | 357/2 |
| 4,142,195 | 2/1979 | Carlson | 357/15 |
| 4,163,677 | 8/1979 | Carlson | 136/89 TP |
| 4,166,919 | 9/1979 | Carlson | 136/89 |
| 4,202,928 | 5/1980 | Staebler | 428/446 |

OTHER PUBLICATIONS

BM16 Bulletin of The American Physical Soc., vol. 24, p. 279, 1979, Authors G. Pike and C. H. Seager.

Primary Examiner—Martin H. Edlow
Attorney, Agent, or Firm—Birgit E. Morris; Donald S. Cohen; Sanford J. Asman

[57] ABSTRACT

A device made of amorphous silicon which exhibits inductive properties at certain voltage biases and in certain frequency ranges in described. Devices of the type described can be made in integrated circuit form.

8 Claims, 2 Drawing Figures

SILICON MOS INDUCTOR

The Government has rights in this invention pursuant to Contract No. ET-78-C-03-2219 awarded by the Department of Energy.

BACKGROUND OF THE INVENTION

The present invention relates to a silicon device which may be used as an inductive element.

Inductive elements are used in many electronic circuits. Generally they are large in size compared to the integrated circuit which with they are used, because conventional inductors cannot be made in integrated circuit form. Accordingly, an integrated circuit device having inductive properties is desirable.

SUMMARY OF THE INVENTION

An MOS inductor comprises an insulating substrate. A conductive metal layer is on the surface of the insulating substrate. An amorphous silicon layer, either hydrogenated or non-hydrogenated, is on the surface of the metal layer. An insulating layer, typically silicon dioxide, is on the surface of the amorphous silicon layer, and a metal contact is on the surface of the insulating layer.

The device acts as an integrated circuit inductive element within certain bias ranges over a certain frequency range.

DETAILED DESCRIPTION OF AN EXEMPLARY EMBODIMENT

The present invention relates to a solid state element that is a varistor with a high parallel inductance.

Figure 2:
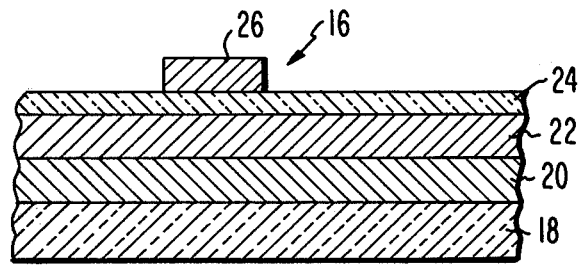
FIG. 2 is a cross-sectional view illustrating the device.

Referring to FIG. 2, a cross-sectional view of the device 16 of the present invention is shown. The device 16 comprises an insulating substrate 18, which in the preferred embodiment of the invention may be made of glass. On the substrate 18, is a metal layer 20. In the preferred embodiment of the invention the metal layer 20 is comprised of molybdenum, which may be evaporated onto the surface of the glass substrate 18. Chromium and stainless steel may be used as alternatives to molybdenum. Over the metal layer 20 is a layer of amorphous silicon 22 of a thickness of between about 500 Å and 2500 Å. The amorphous silicon may be either hydrogenated, in which case it is deposited by a d.c. glow discharge decomposition of silane ($SiH_4$), or it may be non-hydrogenated, in which case it is deposited by sputtering from a silicon target. On the amorphous silicon layer 22 is an insulating layer 24. A layer 24 of silicon dioxide having a thickness of between about 20 Å and 30 Å will grow naturally on non-hydrogenated amorphous silicon. A similar layer 24, which is probably silicon dioxide, but which may contain hydroxide groups, i.e. $SiO_xH_y$ is formed naturally on a hydrogenated amorphous silicon layer 22. On the surface of the insulating layer 24, is a contact 26 of molybdenum, chromium, or stainless steel. In the preferred embodiment, the contact 26 is comprised of molybdenum. The contact 26 has a thickness of about 1500 Å and may be formed by evaporation onto the surface of the layer 24 followed by a photolithographic definition and etch so that the contact 26 has a surface having an area of about 0.33 $mm^2$.

Figure 1:
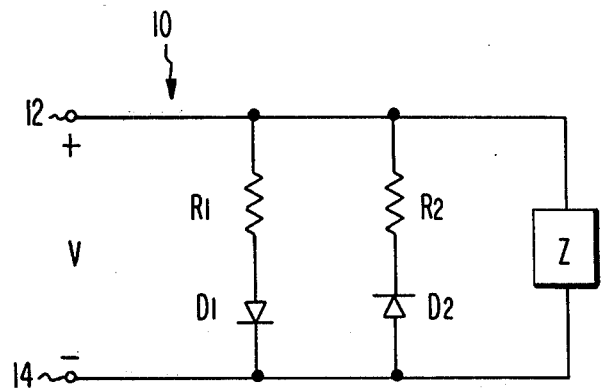
FIG. 1 is a schematic circuit diagram of the device of the present invention.

Referring now to FIG. 1, the device of the present invention can be modeled by the circuit 10. A first resistor $R_1$ and a first diode $D_1$ are connected in series and are electrically connected between input terminals 12, 14. Similarly, a second resistor $R_2$ and a second diode $D_2$ are connected in series between the input terminals 12, 14. The diodes $D_1$ and $D_2$ have their cathodes and their anodes, respectively, connected to the input terminal 14. A component Z is also connected across the input terminals 12, 14.

In the preferred embodiment of the invention, each of the resistors, $R_1$ and $R_2$, has a resistance on the order of 1000 ohms when an input voltage of about 3 volts is applied between the input terminals 12, 14. The reverse bias impedance of each of the diodes, $D_1$ and $D_2$, is greater than 1 megohm.

The component Z has the electrical characteristics of a capacitor. However, for various voltages biases and in various frequency ranges, it exhibits a negative capacitance. As a circuit element, a device which exhibits negative capacitance behaves like an inductor.

In particular, the preferred embodiment of the invention exhibited a negative capacitance when biased between about 2.5 and 3 volts and when operated in the frequency range of about 1.5 KHz to 6 KHz. The maximum negative capacitance exhibited is about $-1000$ pF at about 5 KHz, corresponding to an inductance of about 1 Henry.

The device 16 exhibits the properties described heretofore when the metal layers 20, 26 are used as the input terminals 12, 14. While the values described above are typical, larger inductance values can be reached by proper tuning. All of the values given for $R_1$, $R_2$, and Z are determined by the area of the top metal contact 26. Hence, higher resistance values and lower inductance values can also be obtained by increasing the area of the contact 26. However, it is difficult to increase the area of the contact to more than about 4 $mm^2$ without suffering from the presence of an excessive amount of pinholes in the insulating layer 24.

The effect described results from tunnelling action through the silicon dioxide layer 24. Accordingly, the silicon dioxide layer 24 must be thin enough, i.e. less than about 50 A, to allow tunnelling to occur.

What is claimed is:
1. An MOS inductor comprising:
   (a) an insulating substrate;
   (b) a conductive metal layer on a surface of said insulating substrate;
   (c) an amorphous silicon layer on the surface of said metal layer;
   (d) an insulating layer on the surface of said amorphous silicon layer; and
   (e) a metal contact on the surface of said insulating layer.
2. The MOS inductor of claim 1 wherein said insulating substrate is comprised of glass.
3. The MOS inductor of claim 2 wherein said metal layer consists of a metal selected from the group consisting of molybdenum, chromium, and stainless steel.
4. The MOS inductor of claim 3 wherein said amorphous silicon layer is hydrogenated amorphous silicon.
5. The MOS inductor of claim 3 wherein said amorphous silicon layer is non-hydrogenated amorphous silicon.

6. The MOS inductor of claim 3 wherein said insulating layer is comprised of silicon dioxide.

7. The MOS inductor of claim 6 wherein said metal contact is made of a metal selected from the group consisting of molybdenum, chromium and stainless steel.

8. The MOS inductor of claim 7 wherein said metal contact has an area of less than about 4 mm$^2$.

* * * * *